United States Patent [19]
Chao et al.

[11] Patent Number: 5,633,535
[45] Date of Patent: May 27, 1997

[54] SPACING CONTROL IN ELECTRONIC DEVICE ASSEMBLIES

[76] Inventors: Clinton C. Chao, 51 Waterside Cir., Redwood City, Calif. 94065; Timothy V. Harper, 11260 West Hickory Hill Ct., Boise, Id. 83704; John C. Wynbeek, 10471 Pharlap Dr., Cupertino, Calif. 95014; Eric S. Schneider, 3276 E. Boulder Hights, Boise, Id. 83712

[21] Appl. No.: 379,229

[22] Filed: Jan. 27, 1995

[51] Int. Cl.$^6$ .................... H01L 23/48; H01L 23/52; H01L 29/40
[52] U.S. Cl. .................... 257/778; 257/738; 257/779; 257/780
[58] Field of Search .................... 257/734, 737, 257/738, 779, 780, 781

[56] References Cited

U.S. PATENT DOCUMENTS

| | | |
|---|---|---|
| 4,927,697 | 5/1990 | Hill .................... 428/198 |
| 4,967,950 | 11/1990 | Legg et al. .................... 228/180 |
| 5,056,215 | 10/1991 | Blanton .................... 29/840 |
| 5,130,779 | 7/1992 | Agarwala et al. .................... 357/67 |
| 5,154,341 | 10/1992 | Melton et al. .................... 228/180.2 |
| 5,218,234 | 6/1993 | Thompson et al. .................... 257/778 |
| 5,448,114 | 9/1995 | Kondoh et al. .................... 257/778 |

Primary Examiner—Carl Whitehead, Jr.

[57] ABSTRACT

A method of forming standoff spacer pedestals on a device above the substrate by supporting the electronic device with the standoff spacer pedestals during solder reflow and bonding. Generally, the method comprising the steps of adhering at least one layer of film solder resist on the substrate, and eliminating the undesired portions of dry film solder resist to form the pedestals.

9 Claims, 3 Drawing Sheets

SPACING CONTROL IN ELECTRONIC DEVICE ASSEMBLIES

FIELD OF THE INVENTION

The invention relates to a method and apparatus for placing integrated circuits on a substrate, and more specifically for controlling the spacing between a bare die integrated circuit and the substrate it is electrically and mechanically attached to.

BACKGROUND OF THE INVENTION

Various methods for electrically connecting bare die integrated circuits to printed circuit substrates to form multi-chip modules are well known in the art. Among all the types of multi-chip modules, the technique of flip chip with solder bumps has the most promise with regard to electrical performance, size reduction and price. A flip chip is an unpackaged integrated circuit chip in which the bonding pads have solder bumps formed on them. Solder bumps are approximately hemispherically shaped solidified solder attached to the bonding pads and are typically of a tin-lead composition. The unpackaged chip does not have a plastic shell or metallic leads common to most integrated circuit packages. The active side of the flip chip contains the active devices and bonding pads and has a passivation layer that protects the chip's active components from environmental contaminants. The solder bumps of the flip chip then are positioned in registering contact with the substrate circuit conductive contact areas.

When heated, the bumps reflow and the chip floats on the solder. Depending on the bump volume and spacing, molten solder surface tension and chip weight, this uncontrolled reflow can lead to solder joints of uncontrolled shape and height. The result is that the integrated circuit, or flip chip, will have an unpredictable spacing between it and the substrate it is attached to. Nonuniform operation and shorting out of circuit components can occur when reflow from adjacent bumps run together. Furthermore, fatigue failures of the solder joints can result from stresses caused by differential thermal expansion and contraction between the silicon chip and the organic substrate.

Epoxy underfill is often required for reliability of the flip chip interconnect when attached to substrates like standard printed circuit boards which have thermal coefficients of expansion much different than silicon. The epoxy adds structural strength to the mechanical connection between the flip chip and the substrate, while absorbing most of the stresses that would have otherwise been absorbed by the solder joints as a result of temperature cycling. The epoxy is placed under the flip chip through the use of an underfill process. This process is carried out by flowing the epoxy slowly under the chip. It is then driven the rest of the way under the chip by capillary action. Too narrow of a spacing between the chip and substrate will slow down or stop the underfill rate. Controlling the chip spacing, or standoff, is required for a repeatable underfill flow process. Enhancing or increasing the die standoff provides for a reasonable underfill flow process cycle time. Complete coverage of the underfill material is required for reliability. Complete underfill can be assured by increasing and controlling the chip standoff.

A characteristic of flip chips is that they are physically smaller than their packaged counterparts. As a result, adequate heat dissipation can be a problem. Hence there may be a requirement for heat sink to be physically placed on the chips to enhanced reliability. The placement of heat sinks requires that the physical spacing of the flip chip be well controlled. The attachment of a single heat sink for an array of flip chips also requires uniform chip height and parallel spacing.

A prior solution to controlling the spacing between a flip chip and the substrate is the Controlled Collapse Chip Connection (C4) technique. This technology utilizes bumps by evaporation electro-plating or other means with a composition of 95–97% Pb and Sn. The melting temperature of the bumps exceeds 320° C. In order to use C4 with organic substrates such as FR-4, eutectic solder is added to form the interconnect at a much lower temperature (<183° C.). The disadvantage of this approach is that the total cost for evaporation of the bumps and the addition of eutectic solder on the substrate is high. This approach utilizes a plated copper stud over the metal pads on the substrate which are printed with eutectic solder paste. The hope is that both the copper studs and the lead-rich solder bumps wet the eutectic solder while it melts maintaining a "uniform" spacing of the near eutectic solder between the studs and the leadrich bumps. Control of the "uniform" spacing is limited to a great extent by the tolerance of the paste printed.

U.S. Pat. No. 5,056,215 shows pillars for spacing an integrated circuit above a substrate. The pillars are manufactured by printing layers of dielectric thick film on the substrate. This process is limited because printing the thick film layers does not allow much control of the shape of the pillars. The repeatability of dimension from one pillar to the next is generally poor because screen printing is nonuniform and it is very difficult to manufacture multi-layer pillars due to layer to layer registration errors. All of these characteristics make it difficult to predict and control the spacing dimensions between the bare chip integrated circuit and the substrate.

Another prior solution is to try and constrain the flow of solder, or wicking, on the substrate conductive pads. This is attempted by placing a solder mask or dam over portions of the conductive pads to constrain the solder flow. Solder mask is coated over the conductive traces on a substrate and resists the flow of molten solder. This method enhances the chip standoff by constraining the wicking of the solder onto the substrate by defining the bumps with precisely placed solder mask. The disadvantage of this solution is the difficulty and the cost associated with meeting the required solder mask registration tolerance.

It is desirable to provide controlled standoff for a flip chip integrated circuit to be assembled over a circuit containing substrate with minimal extra material and process steps.

SUMMARY

The present invention provides for a method and apparatus for controlling the spacing between an integrated circuit and the substrate it is electrically and mechanically attached to. The method is inexpensive, easy to implement, and does not require any extra material or special manufacturing.

The standoff is created by adhering on the substrate a film solder resist which is lithographically imaged and developed into film spacer pedestals. When the integrated circuit is flipped over and placed on the substrate it is to be attached to, the spacer pedestals support the integrated circuit above the substrate. The solder bumps are placed so that they are in contact with the conductive pads on the substrate with which they are to make electrical contact. The assembly is then heated until the solder bumps become molten, or reflow. When the state of reflow has been obtained, metal pads which are in contact with the solder bumps will begin to wet with solder. That is, the solder bumps will begin to spread out across the metal pads. This process will act to draw the integrated circuit closer to the substrate. The amount of force created by this process on the integrated circuit results from factors including the volume of the solder bumps, the area of the bump pads, the surface tension of the solder bump and the number of bumps. When the solder joints are formed upon reflow, the plurality of pedestal spacers function as stops against which the integrated circuit moves towards due to the surface tension of the molten solder bond contacts with the conductive pads. Without the presence of the spacer pedestals, the spacing between the substrate and the integrated circuit can be non-parallel, non-uniform, or too narrow. These undesirable situations can lead to premature solder joint failures and make it difficult or impossible to fill the gap between the integrated circuit and the substrate with reliability enhancing epoxy materials. If the integrated circuit requires a heat sink, the attachment of the heat sink may be difficult if the spacing between the integrated circuit and the substrate is not parallel. To counteract the forces described, film spacer pedestals are strategically placed on the contact side of the substrate.

This invention is easy to implement because forming solder resist on substrates is a standard process.

Therefore, typically the formation of the standoff spacer pedestals requires no extra material or processing steps.

DETAILED DESCRIPTION

The present invention encompasses a method of controlling the standoff or spacing between an integrated circuit and the substrate associated with it.

Figure 1:
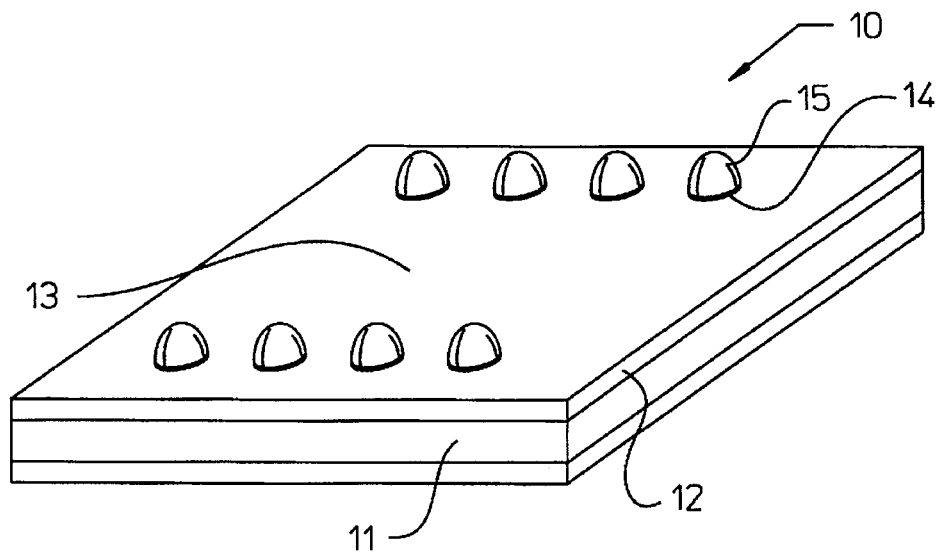
FIG. 1 illustrates a perspective view of the active side of a flip chip.

One application of the present invention is when the integrated circuit is a flip chip. A flip chip is an unpackaged integrated circuit and is represented by the one 10 depicted in FIG. 1. The flip chip 10 has a silicon chip 11 which contains the integrated circuit components and which is coated on the active side 13 with a passivation layer 12 to protect the components from environmental contaminants. It also has a number of metallic bonding pads 14, which are located at various positions on the active side of the flip chip, for making connections with a substrate. Solder bumps 15 are further attached to the bonding pads 14. The integrated circuit could also be a ball-grid array type package.

Figure 2:
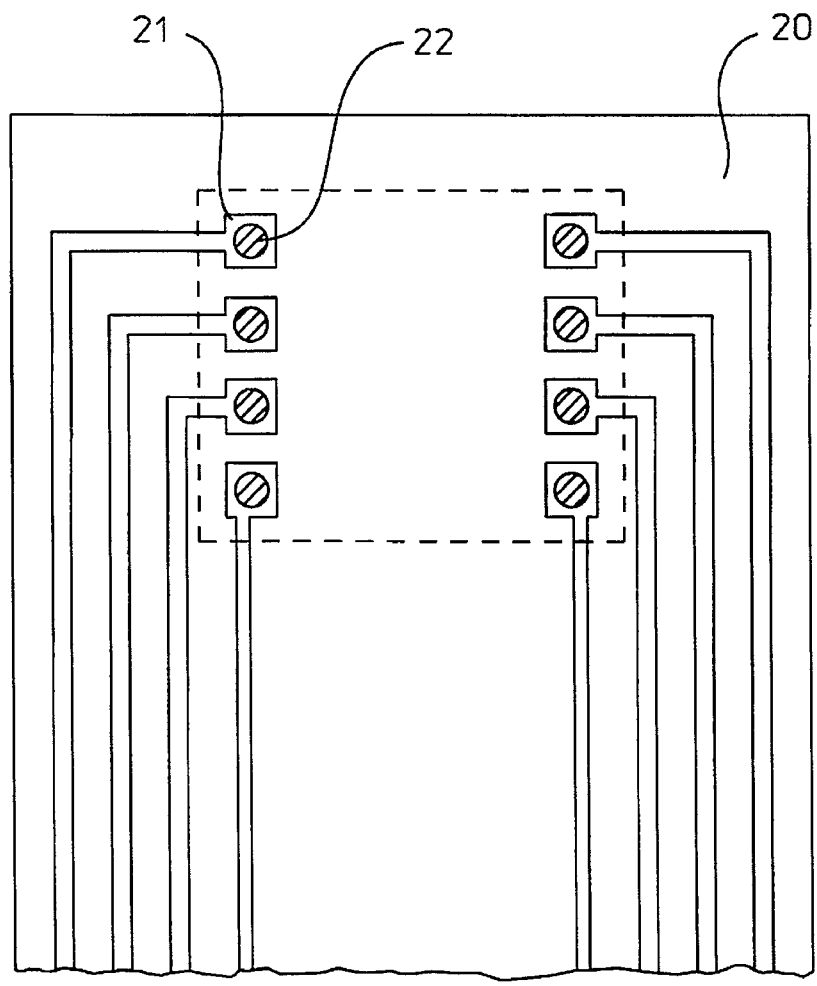
FIG. 2 illustrates a plan view of the active side of a circuit substrate.

A substrate structure is depicted in FIG. 2. The substrate 20 has metallic pads 21 on it for making contact with the electrically active solder bumps 15 of the flip chip 10. The metallic pads 21 are covered with solder mask. The cross hatched area 22 of FIG. 2 represents the area of the pads 21 which are not covered with solder mask. Generally, the solder bumps will adhere during reflow to the area 22 where the solder mask does not exist. The substrate can be manufactured out of various types of materials such as ceramics or silicon. The substrate can also be a standard printed circuit board.

Figure 3:
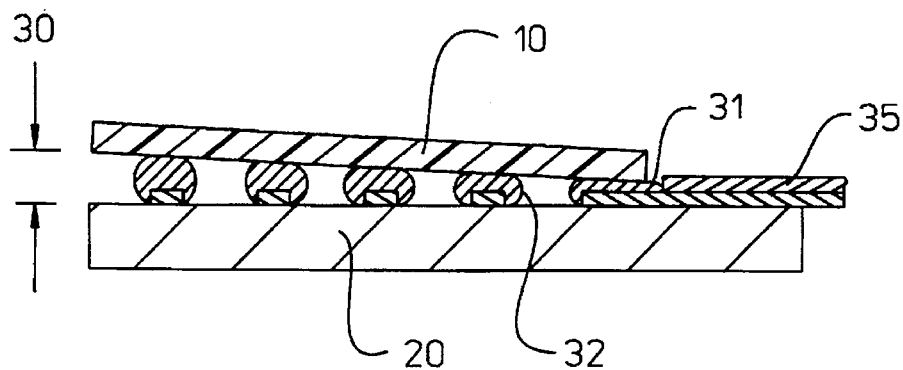
FIG. 3 illustrates the cross-section of a collapsible flip chip interconnect without standoffs.
Figure 4:
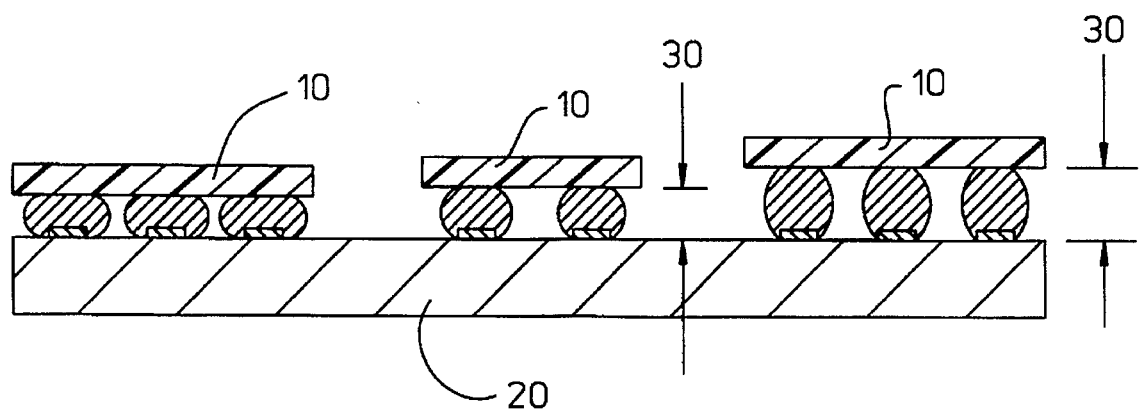
FIG. 4 illustrates the cross-section of a collapsible flip chip interconnect without standoffs.

FIG. 3 depicts what the flip chip interconnection with a substrate 20 looks like when there is no control on the chip spacing over the substrate. When the standoff height 30 of the integrated circuit 10 above the substrate 20 is uncontrolled, the solder bumps will have an undefined shape 32 and run along the conductive metal pads as can be observed at joint 31. The flow of the solder at joint 31 will be constrained only by the solder mask 35. The standoff height will not necessarily be uniform around the perimeter of the integrated circuit. For the reasons stated earlier, an uncontrolled standoff height is undesirable. FIG. 4 shows that the variations in the standoff height 30 can occur between different flip chip assemblies. Several factors contribute to the standoff height variations, such as the volume of solder in each solder bump, the number of solder bump joints, and the weight of the flip chip.

Figure 5:
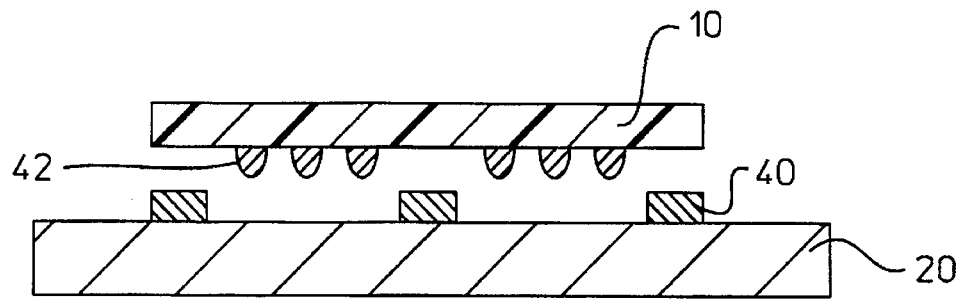
FIG. 5 illustrates the cross-section of a flip chip and substrate with standoffs before connecting.
Figure 6:
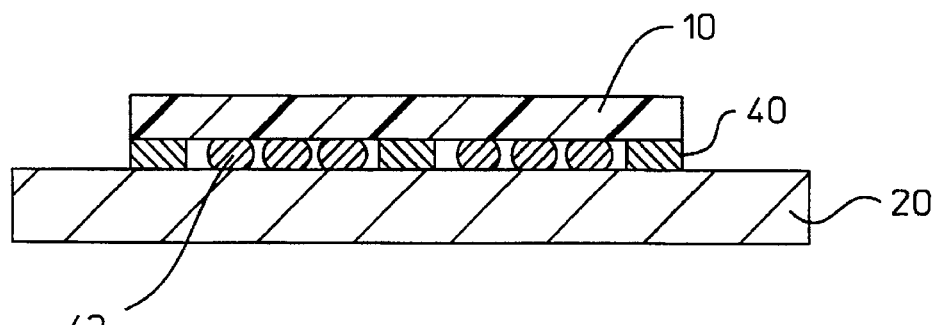
FIG. 6 illustrates the cross-section of a flip chip and the substrate with standoffs after connecting (reflow).
Figure 7:
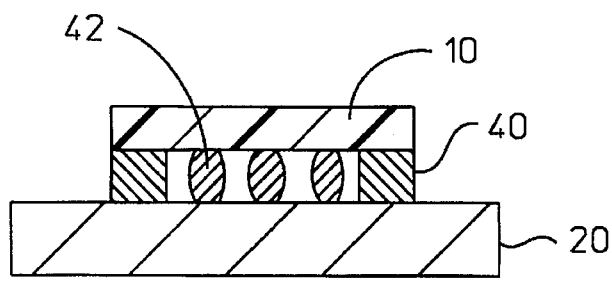
FIG. 7 illustrates the cross-section of a flip chip and substrate with standoffs before connecting (reflow).
Figure 8:
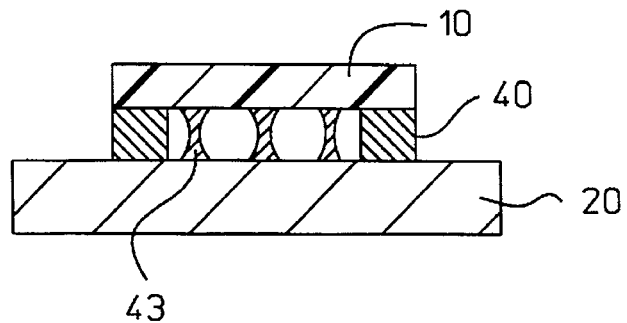
FIG. 8 illustrates the cross-section of a flip chip and the substrate with standoffs after connecting (reflow).

FIG. 5 depicts a before-assembly (before reflow) and FIG. 6 depicts an after-assembly (after reflow) representation of a flip chip 10 that is connected to a substrate when spacer pedestals have been developed on the substrate. It can be observed in FIG. 6 that the integrated circuit 10 above the substrate 20 is of a uniform controlled height 30 around the perimeter of the chip 10. With the spacer pedestals 40, it is also possible to vary the standoff height 30 from chip to chip. FIG. 7 (before reflow) and FIG. 8 (after reflow) depict a flip chip interconnect with a different size pedestal standoffs 40 than those of FIG. 5 and FIG. 6. Precise control over the chip height is possible. Variations in the solder joints 43, depending on the standoff height will result.

The formation of film spacer pedestals is accomplished by following procedures that have been established in depositing solder resist on printed circuit boards. Both liquid and dry films that are photosensitive or non-photosensitive can be used in the formation of the pedestals.

For photosensitive dry film, the first step is to laminate the dry film (solder resist) onto a substrate. This is accomplished by subjecting the substrate with the photosensitive dry film on it to a process which is dependent on time, pressure and heat. The next step is to bake the substrate with photosensitive dry film on it to enhance the adhesion of the dry film to the substrate. A mask with the pedestal art work is then placed on the photosensitive film covered substrate. The masked substrate is then exposed to UV energy, which changes the molecular composition of the photosensitive film. The substrate is then exposed to a developer solution which removes the unwanted film to form the spacer pedestals. Finally, the substrate is hard baked to form the final pedestal. The shape of the pedestal is controlled by designing the shape of the mask, and the height of the pedestal is varied by controlling the thickness of film placed on the substrate or laminating more than one layer of film. The techniques of adhering dry film to a substrate are well understood, and have been developed in the past for functioning as solder resist on printed circuit boards. The typical thickness of the film is 25 to 50 micro meters.

For photosensitive liquid film, the film is adhered to the substrate by either spraying, dipping or spinning it on. The technique of spinning liquid film onto a substrate surface includes dispensing the liquid film onto the substrate surface and spinning the substrate to evenly spread the liquid film over the surface. The liquid film is then baked. The removal of the film once it is dried onto the substrate is the same as described above. The techniques in adhering liquid film to a substrate is well understood in the art. The thickness of the liquid film can be controlled by varying the viscosity of the film or by varying the spin speed when depositing the film. Thin film thickness can be controlled to within approximately one half micrometer.

It is also possible to manufacture film spacer pedestals out of a non-photosensitive film. In a preferred embodiment, a layer of film is deposited on the substrate using either dry or liquid film as described above. Next, a metal thin film is deposited on the film covered substrate. A photo resist is then deposited on the metal thin film. The photo resist is exposed to light, and developed to remove the undesired portions to form the tops of the pedestals. The next step is to strip the resist and etch the metal thin film and the spacer film to form the spacer pedestals. The final step is to etch away the metal thin film and hard bake the spacer pedestal. With this technique, the pedestal width geometry can be more precisely controlled.

Spacers formed by a film subtractive process are superior to the prior art, which uses a printed material additive process to form pedestals. The only requirement of the film used, is that it be able to withstand the reflow temperatures of the solder being used in the particular application. Manufacturing the pedestals out of a film subtractive process allows one to have greater control and consistency over the pedestal shape and height. For example, dry film with a thickness of 76.2 micrometers can be controlled to within ±2.5 micrometers over a 150 centimeter by 150 centimeter flat surface. Therefore, the variation in pedestal height over a 2.0 centimeter by 2.0 centimeter area on the same substrate would be insignificant. With a special process in which the film is laminated onto the substrate with a multi-layer circuit topography by pressing down on the film with a flat surface, the top surfaces of the pedestals can be formed to be as flat as the surface pressing it. The resulting pedestals tops will be as flat as the surface used to press the film. This process can be advantageous in situations where the pedestals must be formed on a non-flat surface of the substrate. For example, when pedestals must be formed on top of circuit board traces. The tops of pedestals formed out of printed material are rounded and not flat when compared to the preferred film subtractive process pedestals. Consistency in the height and shape of the pedestals is extremely important. When a substrate has several pedestals, it is desired that they be the same height so that the integrated circuit that is supported by them will be parallel to the substrate. The placement of the pedestals on the substrate can be just about anywhere that solder joints do not reside.

This invention can be extended beyond the spacing of integrated circuits and substrates. Many types of electronic devices can have the spacing between them controlled with the spacer pedestals described. The film spacer pedestals can be used to control the spacing between a first substrate and a second substrate. Several types of integrated circuits can be used including flip chips and ball grid arrays. Possible substrates include printed circuit board, ceramic substrates, silicon substrates and others.

We claim:

1. An apparatus comprising:

a substrate having a plurality of conductive pads;

an electronic device connected to the substrate; the electronic device having a plurality of solder humps on a surface, the electronic device being electrically and mechanically attached to the substrate such that at least one solder bump is in contact with one of the conductive pads of the substrate; and a film spacer pedestal for controlling the spacing between the substrate and the electronic device, the pedestal physically attached to the substrate, the pedestal physically separated from the solder bumps, the pedestal having a substantially flat face, the flat face being in contact with the electronic device and the spacing being defined by the height of the pedestal.

2. An apparatus as in claim 1, wherein the film spacer pedestal consists of at least one layer of film solder resist.

3. An apparatus as in claim 1, wherein the electronic device is an integrated circuit.

4. An apparatus as recited in claim 1, wherein the electronic device is a flip chip.

5. An apparatus as recited in claim 1, wherein the electronic device is a ball grid array package.

6. An apparatus as recited in claim 1, wherein the substrate is a printed circuit board.

7. An apparatus as recited in claim 1, wherein the substrate is a ceramic substrate.

8. An apparatus as recited in claim 1, wherein the substrate is a silicon substrate.

9. An apparatus as recited in claim 1, further comprising a plurality of film spacer pedestals for controlling the spacing between the substrate and the electronic device, the pedestals physically attached to the substrate, the pedestals physically separated from the solder bumps, the pedestals of substantially the same height and having a substantially flat face, the flat face being in contact with the electronic device and the spacing being defined by the height of the pedestals.

* * * * *